United States Patent
Nandi et al.

(10) Patent No.: US 7,592,772 B2
(45) Date of Patent: Sep. 22, 2009

(54) STATOR INTER-TURN FAULT DETECTION OF SYNCHRONOUS MACHINES

(75) Inventors: Subhasis Nandi, Victoria (CA); Prabhakar Neti, Winnipeg (CA)

(73) Assignee: University of Victoria Innovation and Development Corporation, Victoria, BC (CA)

( * ) Notice: Subject to any disclaimer, the term of this patent is extended or adjusted under 35 U.S.C. 154(b) by 6 days.

(21) Appl. No.: 11/868,934

(22) Filed: Oct. 8, 2007

(65) Prior Publication Data

US 2009/0091289 A1  Apr. 9, 2009

(51) Int. Cl.
H02P 25/00 (2006.01)
(52) U.S. Cl. .................. 318/798; 324/772; 324/545; 340/648
(58) Field of Classification Search .................... 361/30; 324/772, 545; 340/648; 318/798, 803, 806, 318/565, 629, 690, 705, 773, 807, 822, 244
See application file for complete search history.

(56) References Cited

U.S. PATENT DOCUMENTS

| | | | | |
|---|---|---|---|---|
| 4,136,312 A | * | 1/1979 | Salon et al. | 324/545 |
| 4,164,705 A | * | 8/1979 | Whitney et al. | 324/772 |
| 4,377,784 A | * | 3/1983 | Saito et al. | 324/772 |
| 4,808,932 A | * | 2/1989 | Schulz et al. | 324/545 |
| 4,940,932 A | * | 7/1990 | Herrick et al. | 324/772 |
| 5,045,779 A | * | 9/1991 | Herrick et al. | 324/772 |
| 5,252,915 A | * | 10/1993 | Sedding et al. | 324/772 |
| 5,461,329 A | * | 10/1995 | Linehan et al. | 324/772 |
| 5,739,698 A | * | 4/1998 | Bowers et al. | 324/772 |
| 5,786,708 A | * | 7/1998 | Premerlani et al. | 324/772 |
| 6,041,287 A | * | 3/2000 | Dister et al. | 702/182 |
| 6,043,664 A | * | 3/2000 | Kliman et al. | 324/545 |
| 6,064,172 A | * | 5/2000 | Kuznetsov | 318/716 |
| 6,611,771 B1 | * | 8/2003 | Habetler et al. | 702/58 |
| 6,640,196 B1 | * | 10/2003 | Unsworth et al. | 702/115 |

OTHER PUBLICATIONS

G. Kron, Equivalent Circuits of Electric Machinery, New York: Wiley (1951), p. 182.
G.B. Kliman et al., "Noninvasive detection of broken bars in operating induction motors," IEEE Trans. Energy Conv. 3:873-879 (Dec. 1998).
P. Neti et al., "Stator Inter-turn Fault Detection of Synchronous Machines Using Field Current Signature Analysis," 41$^{st}$ IAS Annual Meeting, Tampa, Florida, Oct. 8-12, 2006, p. 2360-2367.

* cited by examiner

Primary Examiner—Bentsu Ro
Assistant Examiner—Antony M Paul
(74) Attorney, Agent, or Firm—Klarquist Sparkman, LLP

(57) ABSTRACT

A fault detection system using field current and rotor search coil voltage harmonics is provided. The technology is capable of detecting an inter-turn fault unambiguously and rapidly in a synchronous machine. The internal asymmetry of the machine that has adversely affected the earlier fault diagnosis results has, for the first time, been shown as an advantage.

19 Claims, 14 Drawing Sheets

Prior Art

STATOR INTER-TURN FAULT DETECTION OF SYNCHRONOUS MACHINES

FIELD

The technology relates to a fault detection system using field current and rotor search coil voltage harmonics. More specifically, the technology relates to a method and system for inter-turn fault detection.

BACKGROUND

Inter-turn faults in synchronous machines can lead to catastrophic failure of the machine. The time elapsed in the growth of an incipient fault leading to a catastrophic failure of the machine varies from a third of a second to several minutes in the case of random-wound machines and can even be much longer in the case of form-wound machines. Hence, early detection of such faults involving few turns is desirable in order to protect them.

U.S. Pat. No. 6,611,771 discloses a stator turn fault detection system and method capable of real-time detection of a stator turn fault in an electric motor. The stator turn fault detector includes a feed forward neural network that when trained, using fundamental frequency sequence components of the voltage and current supplying the electric motor, will estimate a fundamental frequency sequence component of current indicative of a stator turn fault. A method for detecting a stator turn fault in an electric motor as well as a method for training a feed forward neural network for use with the stator turn fault detector is also disclosed.

The use of harmonics to detect inter-turn faults has been disclosed in Penman and Jiang, "The detection of stator and rotor winding short circuits in synchronous generators by analyzing excitation current harmonics," International Conference on Opportunities and Advances in International Electric Power Generation, Conf. Publ. No. 419, pp. 137-142, March 1996. However, some of the even harmonics described in this paper in the field current for detection of stator fault can also increase with supply unbalance, and can lead to serious confusion in synchronous machine monitoring. These harmonics can be induced in the two-coil or four coil (standard) field windings. Therefore, not all harmonics can be used reliably to detect inter-turn faults. Accordingly, there is a need for a method to determine the harmonic or harmonics that can be used to detect inter-turn faults.

It is an object of the present technology to overcome the deficiencies in the prior art.

SUMMARY

The present technology is capable of detecting an inter-turn fault unambiguously and rapidly in a synchronous machine. The internal asymmetry of the machine that has adversely affected the earlier fault diagnosis results has, for the first time, been shown as an advantage.

In order to protect the machine using the present technology, only one signal needs to be monitored. Hence it is very easy to implement compared to the negative sequence technique that requires four sensors (two for line voltages and two for line currents). Fewer sensors implies fewer channels of the data acquisition system, less data processing and therefore very high-speed tripping of the faulty machine at a lower cost.

In one embodiment, a method of detecting a stator inter-turn fault in a synchronous machine is provided. The method comprises:
  (i) collecting machine characteristics;
  (ii) predicting at least one harmonic for monitoring the machine based on the collected machine characteristics; and
  (iii) monitoring the at least one harmonic, thereby detecting a stator inter-turn fault.

In one aspect a ratio of the at least one harmonic frequency to a line frequency is proportional to a sum of a ratio of a positive integer to a fundamental number of pole and integer one.

In another aspect the at least one harmonic is selected by inputting machine characteristics into equation 12.

In another aspect the harmonics are odd whole number harmonics or fractional harmonics.

In another aspect a current harmonic is detected.

In another aspect a voltage harmonic is detected.

In another aspect the detecting is effected with a rotor search coil.

In another aspect, the method further comprises generating a tripping signal.

In another embodiment, a system for detecting a stator inter-turn fault in a synchronous machine is provided. The system comprises:
  (i) a look up table for determining at least one harmonic to be monitored;
  (ii) a tunable detector; and
  (iii) a signal processor.

In one aspect the signal processor is a digital signal processor.

In another aspect the signal processor is a computer.

In another aspect the tunable detector detects field current.

In another aspect the tunable detector detects rotor search coil voltage.

In another embodiment a system for detecting a stator inter-turn fault in a synchronous machine is provided. The system comprises:
  (i) a frequency selector;
  (ii) a rotor search coil;
  (iii) a tunable detector; and
  (iv) a signal processor.

The frequency selector is typically configured to establish one or more frequencies for fault detection and monitoring. These fault detection frequencies $f_d$ are typically defined as $f_d = \{(k/p) \pm 1\} f$, wherein k is a positive integer, p is a number of machine fundamental pole pairs (i.e., a number of fundamental poles divided by 2), and f is a line frequency. The frequency selector can be implemented as part of a signal processor based on a database of selected fault detection frequencies, and can include a detector configured to estimate a frequency associated with power generated by or supplied to the synchronous machine.

These and other features and aspects of the disclosed technology are set forth below with reference to the accompanying drawings.

DETAILED DESCRIPTION

As used in this application and in the claims, the singular forms "a," "an," and "the" include the plural forms unless the context clearly dictates otherwise. Additionally, the term "includes" means "comprises." The described systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

Experimental results were obtained by physically shorting different numbers of stator turns in a 2 kW motor. A comparative study of the characteristic frequency components was completed with different fault levels and supply unbalance. An equation was developed to predict the harmonics best suited to detect an inter-turn fault in any synchronous machine. The utility of the equation was then verified.

EXAMPLE 1

(i) Description of Motor and Selection of Fault

Figure 1:
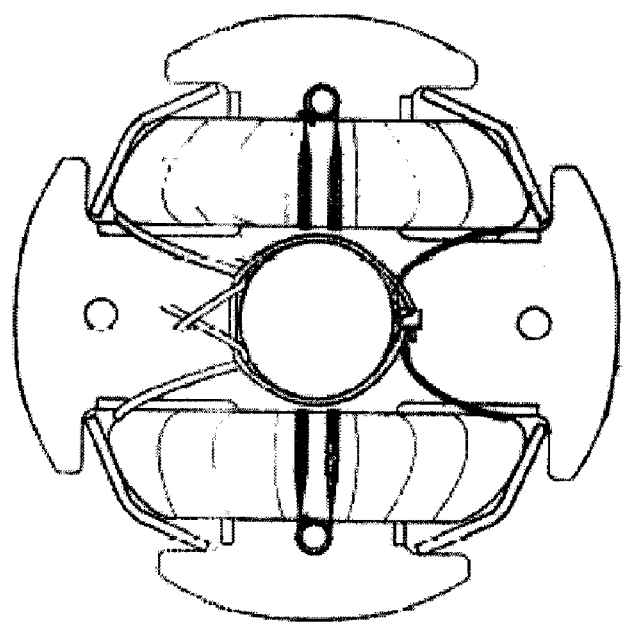
FIG. 1 is a cross-section of a prior art rotor of synchronous motor with two-coil field winding.

The salient-pole synchronous motor was a 208 V, 1800 rpm, 60 Hz, 2 kW, 4-pole random-wound machine having 36 stator slots. The stator had a 3-phase double layer lap winding and the rotor had 20 damper bars. The field winding of the machine comprised of two series-connected coils, each placed on the diagonally opposite rotor poles. This was done for the ease of construction. Each coil side occupied each of the inter-polar gaps. A cross-section of a rotor of synchronous motor with two-coil field winding is shown in FIG. 1. A search-coil was also mounted on one of the pole faces of the rotor. Also, several taps were brought out from the stator winding (phase-a) to physically create the inter-turn faults.

Ideally, though the flux pattern produced by the two-coil field winding will be similar to that produced by a standard four-coil field winding (one coil on each pole), their turns functions are different as given later in Eqs. (9)-(10). However, because of inevitable manufacturing and magnetic asymmetries, the turns function of any actual field winding will be more like the one given in Eq. (11). This will be referred to as the asymmetric field winding.

(ii) Mechanism of Induction of Even Harmonics in Field Current Under Supply Unbalance With unbalanced 3-phase voltages, a balanced 3-phase stator winding produced a reverse rotating magnetomotive force (MMF) wave given as $$F_s = A_s \cos[np\phi + \omega t],\quad(1)$$

wherein n=(6k±1) other than fundamental, is the order of space harmonics produced by a balanced 3-phase stator winding, k=1, 2, 3 . . . etc., $\phi$=angular position with respect to the stator, p=no. of fundamental pole-pairs=2, $\omega=2\pi f$ and f=supply frequency. Considering only the DC part of the specific permeance function ($P_0$), the flux density produced by this MMF, with respect to stator, can be given as $$B_s = A_s P_0 \cos(np\phi + \omega t)\quad(2)$$

or with respect to rotor, $$B_r = A_s P_0 \cos(np\phi' + np\omega_s t + \omega t + \phi_1)\quad(3)$$

Here, $\phi'$=angular position with respect to the rotor and $\omega_s$=synchronous speed in radian/second. Substituting $\omega_s=\omega/p$ in Eq. (3), the flux density with respect to rotor, can be given as $$B_r = A_s P_0 \cos\{np\phi' + (n+1)\omega t + \phi_1\}.\quad(4)$$

$B_r$ can induce a particular frequency component in a winding if and only if the pole-pair of $B_r$ corresponding to that frequency matches with one of the pole-pairs of the winding (see, for example, G. Kron, *Equivalent Circuits of Electric Machinery*, New York: Wiley, 1951). From Eq. (4), the 120 Hz component is produced with n=1 and f=60 Hz. The pole-pair associated with 120 Hz component is n*p=2 for the chosen motor. Hence, the 120 Hz component can be induced in the two-coil, four-coil and asymmetric field windings, since all of these windings can produce the pole-pair number 2 as seen in Eqs. (9)-(11). For n=5, a 360 Hz component can be produced.

(iii) Mechanism of Induction of Various Harmonic Components in Field Current with Stator Fault In the case of a synchronous motor with a stator inter-turn fault, induction of various harmonic components in the field winding can be proved as follows. The stator has a shorted loop (can thus be treated as a single-phase winding) carrying current at a supply frequency that generates two counter-rotating MMF waves (see, for example, Kliman et al., "Non-invasive detection of broken bars in operating induction motors," IEEE Trans. Energy Conv. 3: 873-879 (1988)), which can be given as $$F_{sf} = A_f \cos[k\phi \pm \omega t], \quad (5)$$

wherein k=1, 2, 3 . . . etc. Considering the DC part of the specific permeance function ($P_0$), the flux density produced by this MMF, with respect to stator, can be given as $$B_{sf} = A_f P_0 \cos(k\phi \pm \omega t) \quad (6)$$

or with respect to rotor, $$B_{rf} = A_f P_0 \cos(k\phi' + k\omega_s t \pm \omega t + \phi_2) \quad (7)$$

Substituting $\omega_s = \omega/p$ in Eq. (7), we can have $$B_{rf} = A_f P_0 \cos[k\phi' + \{(k/p) \pm 1\} \omega t + \phi_2]. \quad (8)$$

The components that showed promise from experiments were 60, 90, 150 and 210 Hz. With p=2 and k=4, from Eq. (8), the 60 Hz component can be produced. Since k=4, the 60 Hz component can be induced in the symmetric winding of two-coil structure and the asymmetric windings of both structures, since the asymmetric winding can produce all k=1, 2, 3 . . . pole-pairs, as given in Eq. (11). However its magnitude is expected to be much higher for the two-coil structure since the pole pair number 4 arises out of the symmetric structure itself. Similarly, with k=1, 3, 5 and 7, the 90 Hz and 150 Hz components can be induced in the asymmetric field winding. These components cannot be induced in the ideal two and four coil field windings, since these windings produce pole pair numbers 2, 4, 6 . . . etc. (Eq. (9)) and 2, 6, 10 . . . etc. (Eq. (10)), respectively. Using a similar argument, it can be shown that all other even harmonics can also be induced in the ideal two-coil, four-coil as well as asymmetric field winding because of an inter-turn fault in the stator winding. Table I shows for different values of k and p=2 the various harmonics that can be induced in the asymmetric field winding with 60 Hz utility supply.

EXAMPLE 2

(i) Modeling of Synchronous Motor with Stator Inter-turn Fault and Asymmetric Field Winding In order to carry out the simulation studies, the salient-pole synchronous motor was modeled including the damper bars. Following are the four different machine models obtained for each of the two-coil and the four-coil field windings: (a) healthy machine with symmetric field winding; (b) healthy machine with asymmetric field winding; (c) faulty machine with symmetric field winding; and (d) faulty machine with asymmetric field winding. Thus, eight different models were obtained. The asymmetric field winding was modeled by choosing different number of turns in one of the coils. The models of faulty machine can accommodate different number of shorted turns in the stator winding.

The Fourier series expansions of the turns functions of the symmetric two-coil and standard field windings are expressed in Eq. (9) and Eq. (10) respectively. Fourier series expansion given in Eq. (11) represents the general form of asymmetric field winding. The coefficients will be different for the two-coil and standard structures. $\theta_d$ and $\theta_q$ are the angles subtended by the rotor polar and inter-polar arcs at the center respectively.

$$n_{rf1}(\phi, \theta) = a_{orf1} + \sum_{m=1,2,3,\ldots}^{\infty} a_{mrf1} \cos[pm(\phi - \theta)] \quad (9)$$

$$a_{orf1} = \frac{N_{rf} \theta_d}{\pi}, \; N_{rf} = 1260, \; a_{mrf1} = \frac{2N_{rf}}{\pi m} \sin(m\theta_d)$$

$$n_{rf2}(\phi, \theta) = a_{orf2} + \sum_{q=1,3,5,\ldots}^{\infty} a_{qrf2} \cos[pq(\phi - \theta)] \quad (10)$$

$$a_{orf2} = \frac{N_{rf}}{2}, \; N_{rf} = 1260, \; a_{qrf2} = \frac{2N_{rf}}{\pi q} \sin(q\theta_d)$$

$$n_{rfa}(\phi, \theta) = a_{orfa} + \sum_{w=1,2,3,\ldots}^{\infty} a_{wrfa} \cos[w(\phi - \theta)] \quad (11)$$

After computing various magnetizing and mutual inductances of the machine using winding function approach (WFA) and modified winding function approach (MWFA), the dynamic models of the synchronous motor have been obtained using the coupled circuit approach. These approaches are described in, for example, Luo et al., "Multiple coupled circuit modeling of induction machines," IEEE Trans. Industry Applications 3:311-318, March/April 1995; Toliyat and Lipo, "Transient analysis of cage induction machines under stator, rotor bar and end ring faults," IEEE Trans. Energy Conversion 10:241-247, June 1995; Toliyat et al., "A method for dynamic simulation of air-gap eccentricity in induction machines," IEEE Trans. Industry Applications, 32:910-918, July/August 1996, and Al-Nuaim and Toliyat,

TABLE I

Harmonic Components in Field Current

| | | | | | k | | | | | |
|---|---|---|---|---|---|---|---|---|---|---|
| | 1 | 2 | 3 | 4 | 5 | 6 | 7 | 8 | 9 | 10 |
| Freq. (Hz) | 30 | 0 | 30 | 60 | 90 | 120 | 150 | 180 | 210 | 240 |
| | 90 | 120 | 150 | 180 | 210 | 240 | 270 | 300 | 330 | 360 |

Figure 2:
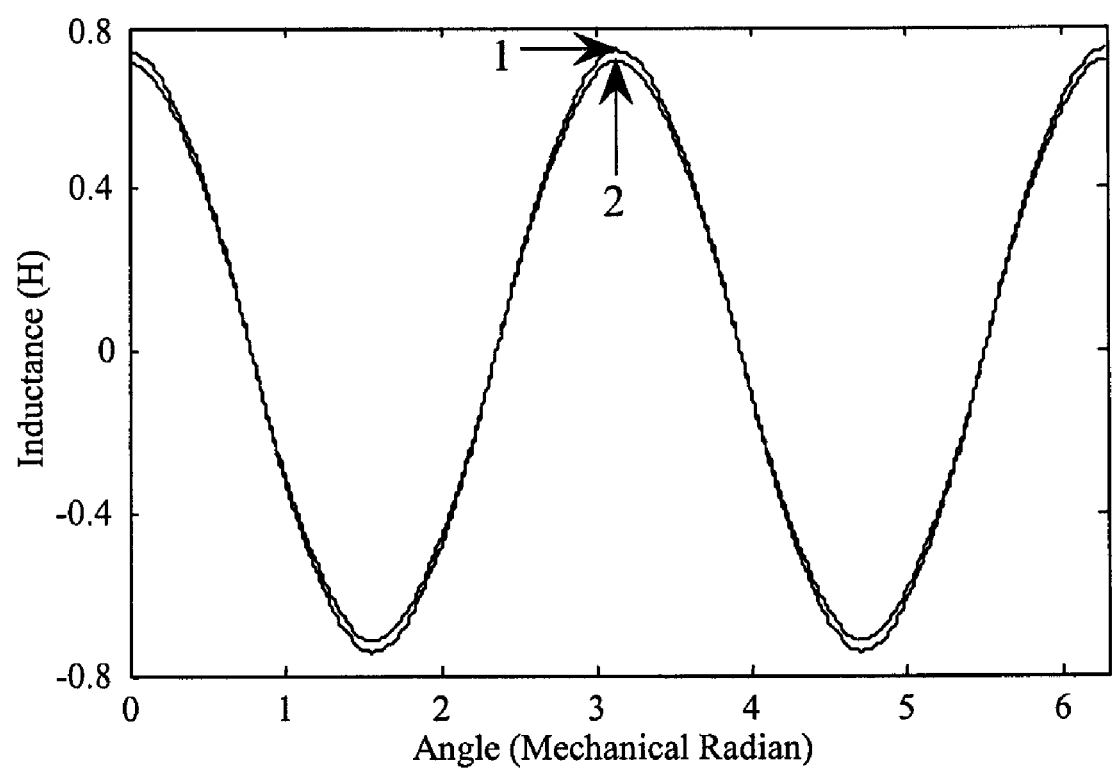
FIG. 2 is a plot of mutual inductance between the stator phase-a and the two-coil field winding for symmetric (1) and asymmetric (2) construction.
Figure 3:
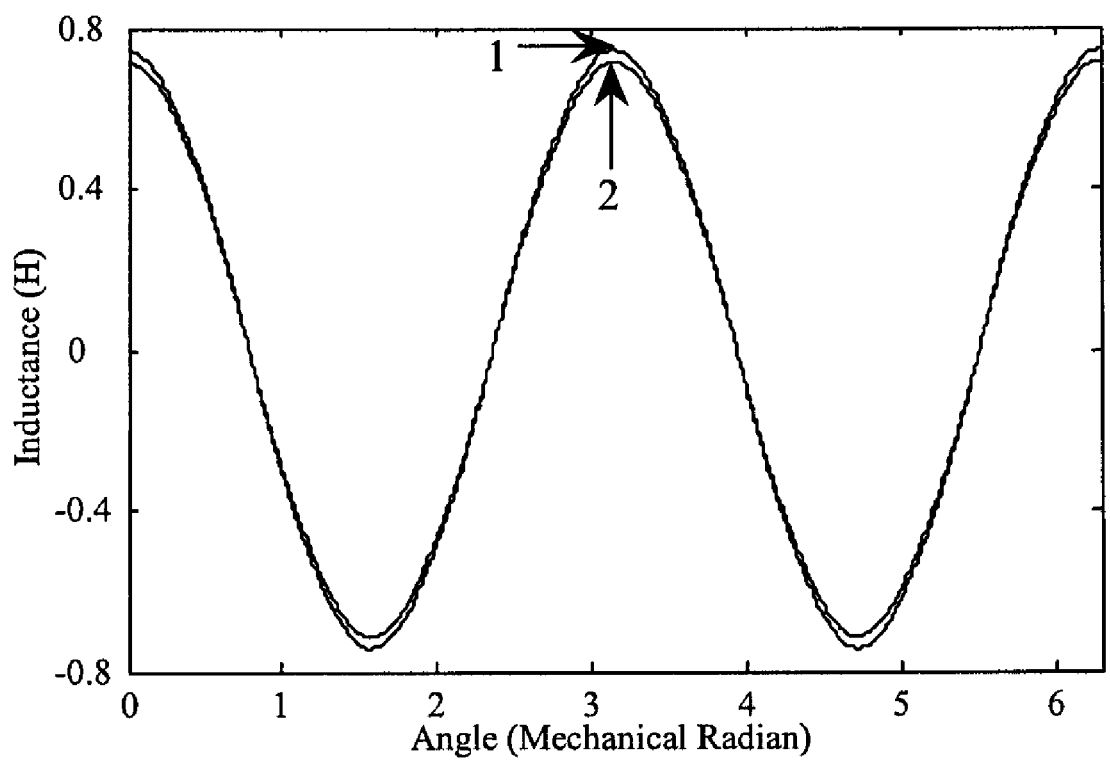
FIG. 3 is a plot of mutual inductance between the stator phase-a and the standard field winding for symmetric (1) and asymmetric (2) construction.

"A novel method for modeling dynamic air-gap eccentricity in synchronous machines based on modified winding function theory," IEEE Trans. Energy Conversion 13:156-162, June 1998. The mutual inductances between stator phase-a and the field windings with both of symmetric and asymmetric cases are shown in FIG. 2 (for two-coil structure) and FIG. 3 (for standard structure).

(ii) Simulation Results

Figure 4:
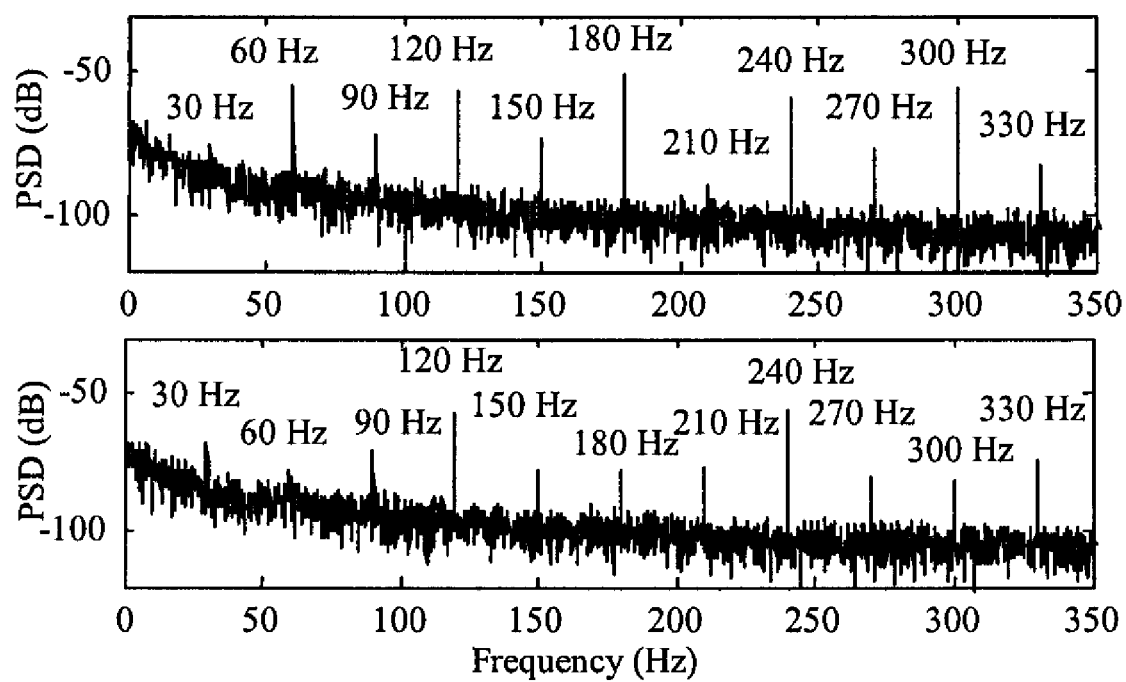
FIG. 4 contains plots of power spectral density (PSD) of field current of the simulated motor with asymmetric two-coil (top) and standard field winding (bottom) with four-turn fault.
Figure 5:
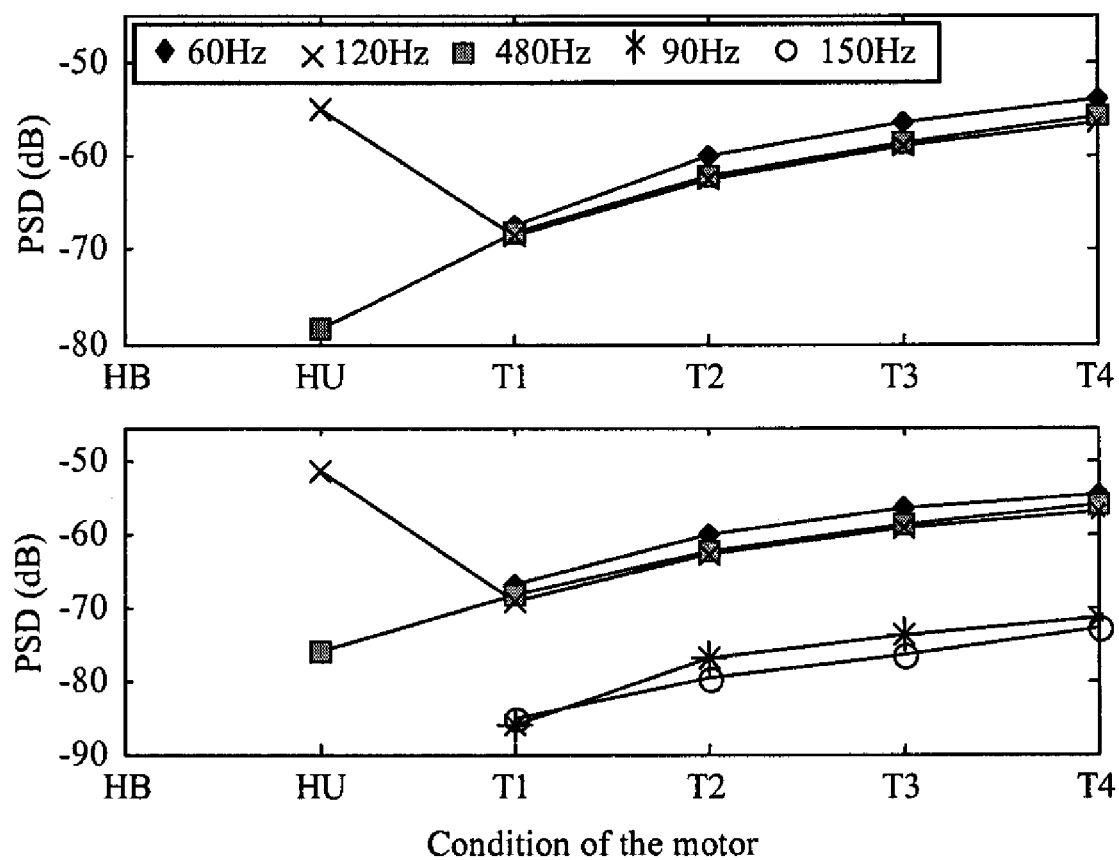
FIG. 5 contains plots of frequency components in the field current of simulated motor with two-coil structure, top (symmetric) and bottom (asymmetric).
Figure 6:
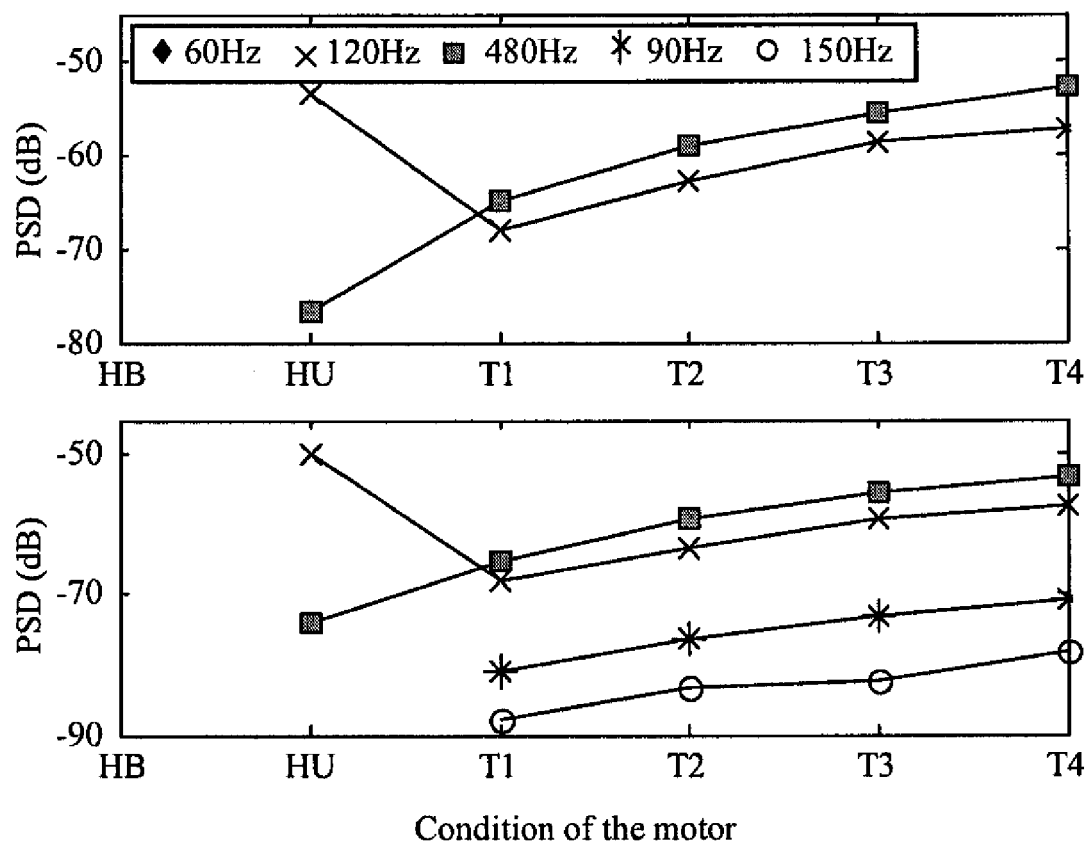
FIG. 6 contains plots of frequency components in the field current of simulated motor with standard structure, top (symmetric) and bottom (asymmetric).

A simulation study was carried out using the eight different models of the machine as mentioned in the earlier section. The results were obtained at full-load, 0.88 lagging power factor and rated field current of the machine. The spectra for motor models with asymmetric two-coil and the four-coil field windings and four-turn fault are shown in FIG. 4. Since the coefficients of the cosine functions in Eq. (11) are different for the two structures, the frequency components in the two have dissimilar magnitudes. However no components other than those predicted by Table I appeared. A detailed comparative study of the various frequency components in the field current is shown in FIGS. 5 and 6. The condition of the motor is shown on x-axis of the plots. 'HB' and 'HU' denote the healthy machine fed by balanced and unbalanced supplies respectively whereas 'T1' to 'T4' represent 1 to 4 turn shorts in the stator winding. The plots were normalized with respect to the DC component of the field current. As predicted in the preceding sections, the 120 and 480 Hz components appear with supply unbalance as well as with turn faults. This was observed in the case of symmetric and asymmetric field windings of both structures. Hence the changes in the even harmonics may not clearly distinguish faulty and unbalanced supply conditions.

In the case of both symmetric and asymmetric two-coil structures of field winding, the 60 Hz components were sensitive to the inter-turn faults as predicted. However, this component did not show any increase in the symmetric standard field winding as predicted and did not increase significantly even in the case of asymmetric winding for the chosen amount of asymmetry.

Most importantly, in the case of asymmetric windings of both structures, the 90 and the 150 Hz components showed a clear increase only with stator faults as predicted. Also, in the case of healthy machine with both symmetric and asymmetric field windings, these components were absent with supply unbalance as shown in FIGS. 5 and 6.

Figure 7:
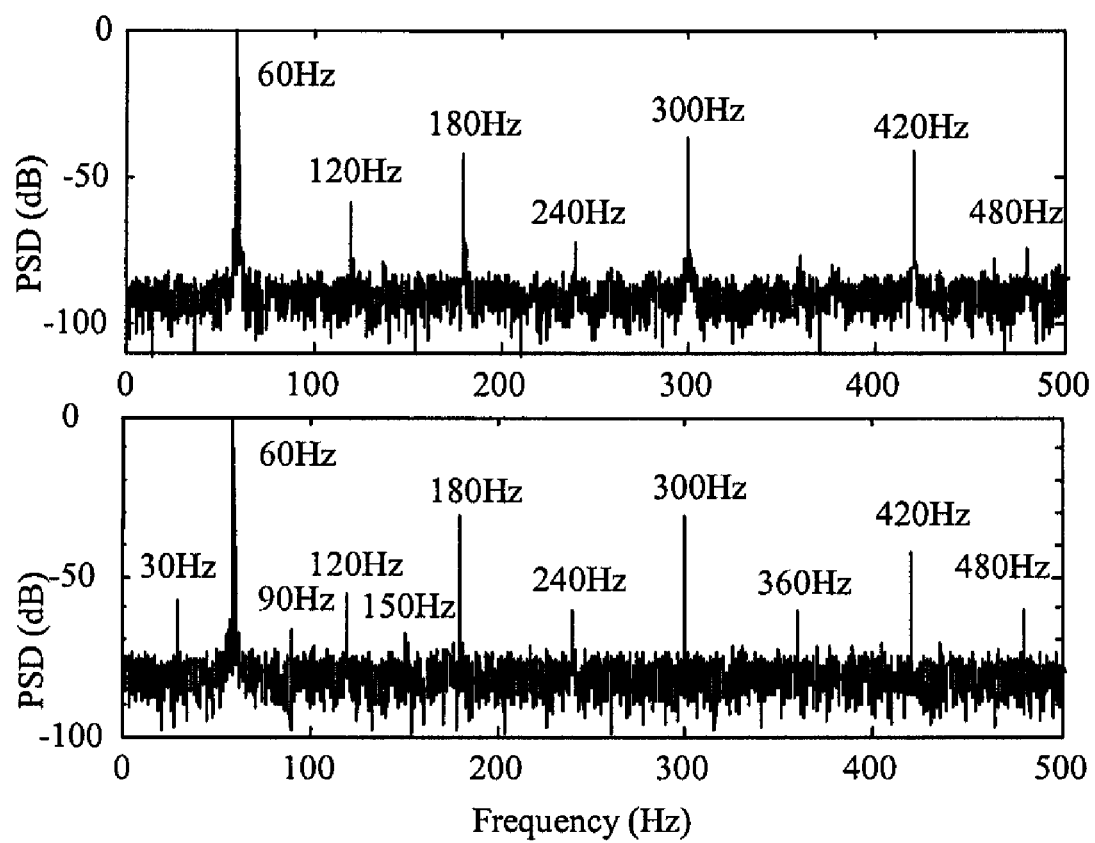
FIG. 7 contains plots of PSD of line voltage (top) and line current (bottom) of the experimental motor with two-coil field winding.
Figure 8:
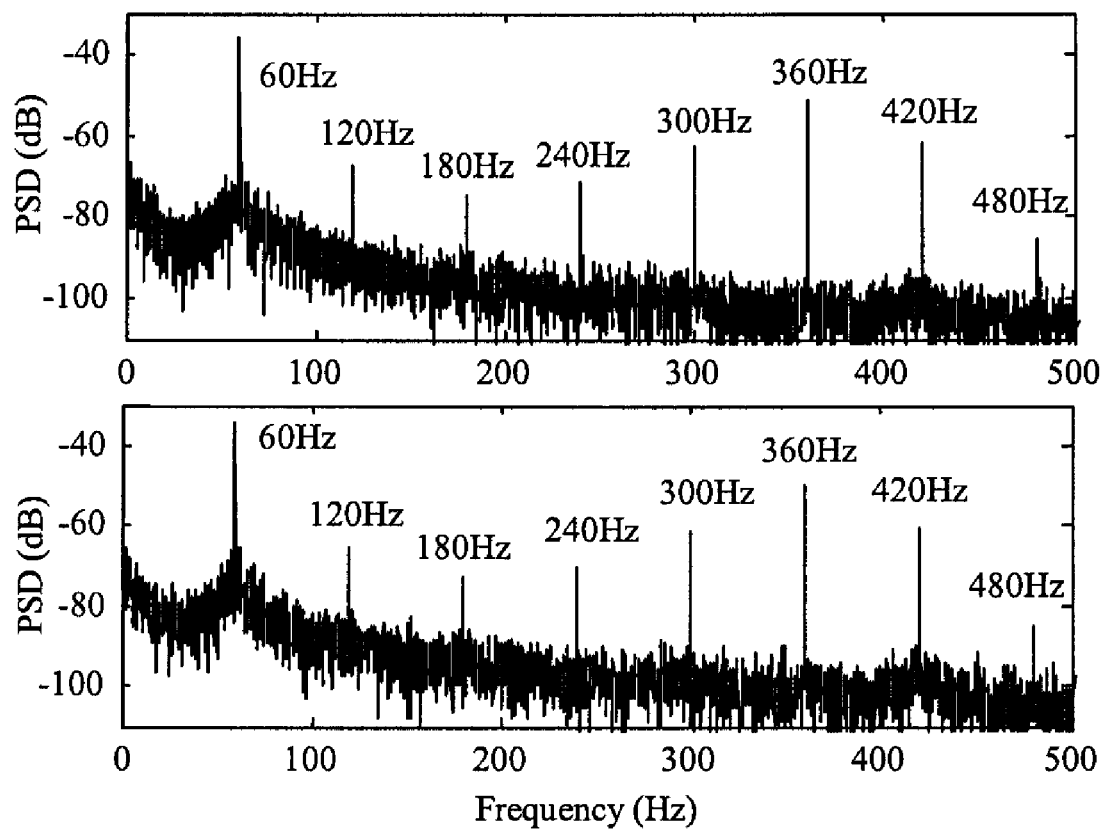
FIG. 8 contains plots of PSD of field current of the simulated motor with asymmetric two-coil (top) and standard field winding (bottom) with utility voltage data.

The utility supply has many time harmonics, which can also induce some harmonic components in the field current. In order to investigate their influence, first the spectra of the line voltage and the line current of the experimental motor (with two-coil structure) were obtained as shown in FIG. 7. It is interesting to note that the line current had more harmonics than the voltage, such as, for example, but not limited to 30, 90, 150 Hz. It is therefore apparent that these additional harmonics are because of causes internal to the machine. Some of these causes were, for example, but not limited to eccentricity, saturation, structural asymmetry. All these frequency components can induce various harmonics in the field current of an actual machine, as can be seen from FIGS. 9 and 13 in the experimental section. However, with the kind of asymmetry considered for simulation, only supply voltage harmonics were reflected back in the field current (FIG. 8) and not the 90 and 150 Hz components. FIG. 8 was obtained using actual voltage data collected from utility supply.

(iii) Experimental Results

A motor with a two-coil field winding was rigorously tested in the laboratory with different fault levels at various loads and power factors. In order to ensure unambiguous detection of the fault, the influence of supply unbalance on the test results was also carefully observed. It was also noticed that the sensitivity of the current sensor is important in detecting the harmonics in question.

Figure 9:
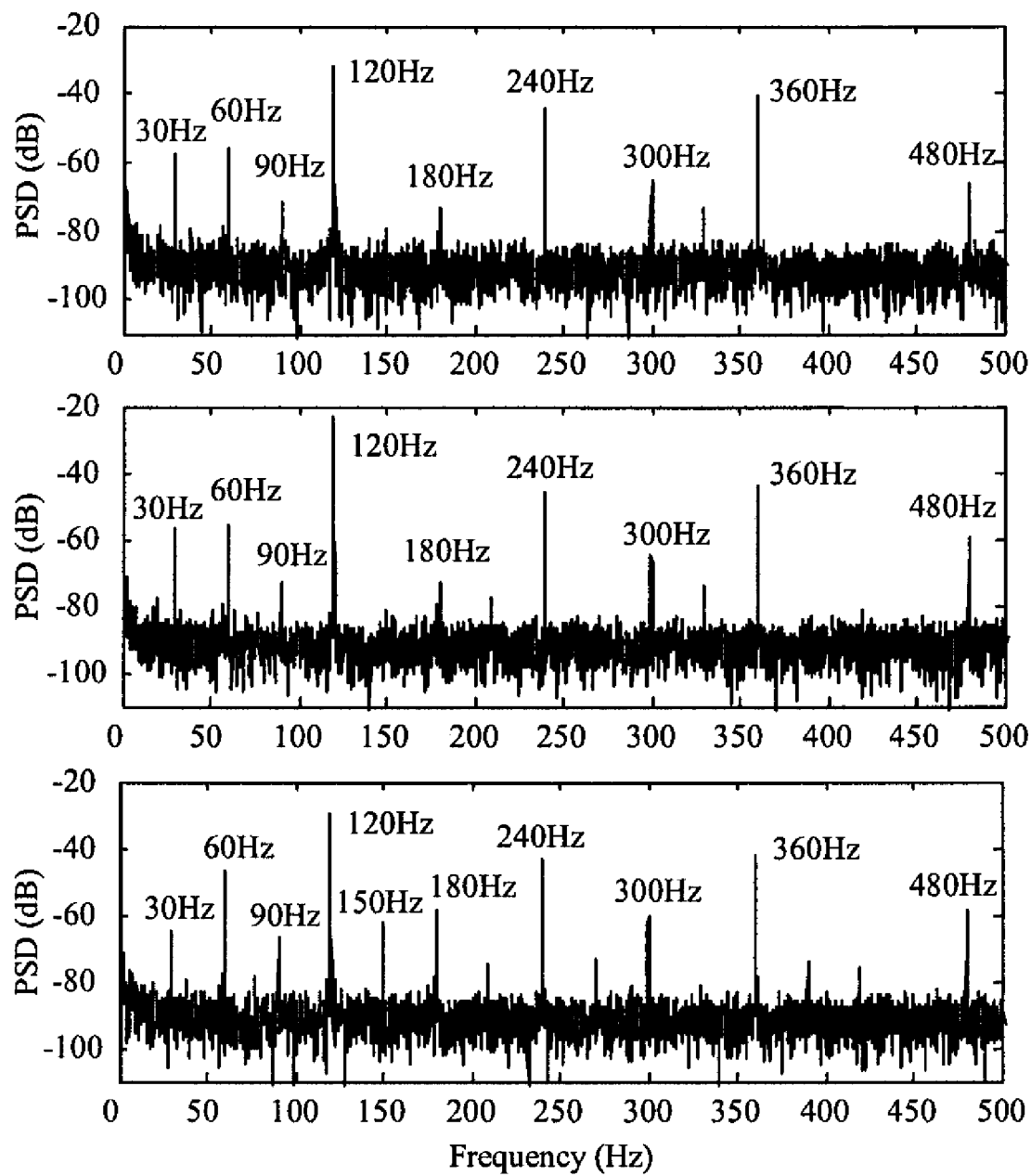
FIG. 9 contains plots of experimental PSD of field current under full-load, 0.8 lagging pf condition with balanced supply (top), with unbalanced supply (middle) and with 4-turn fault (bottom) for two-coil field winding.
Figure 10:
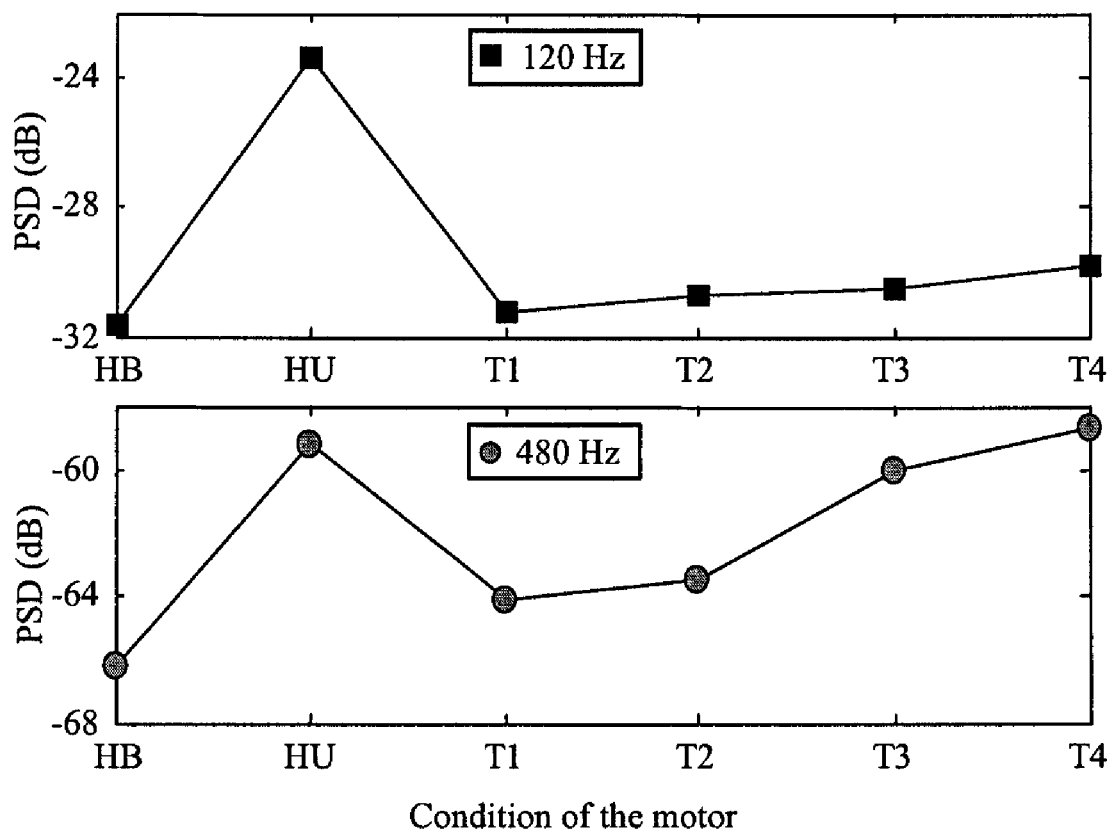
FIG. 10 contains plots of 120 Hz (top) and the 480 Hz (bottom) components in the field current under full-load, 0.8 lagging pf condition (experimental).

A significant increase at the 120 and 480 Hz harmonics was observed in the field current of the healthy machine with supply unbalance ($V_{ab}$=199.9 V, $V_{bc}$=208.1 V and $V_{ca}$=206.9 V) as shown in FIG. 9. The variation of the 120 and 480 Hz harmonics under supply unbalance and turn fault condition of the motor at full-load (0.8 lag) is shown in FIG. 10. An even larger increase of these harmonics under supply unbalance compared to faulty conditions indicated the ambiguity.

Figure 11:
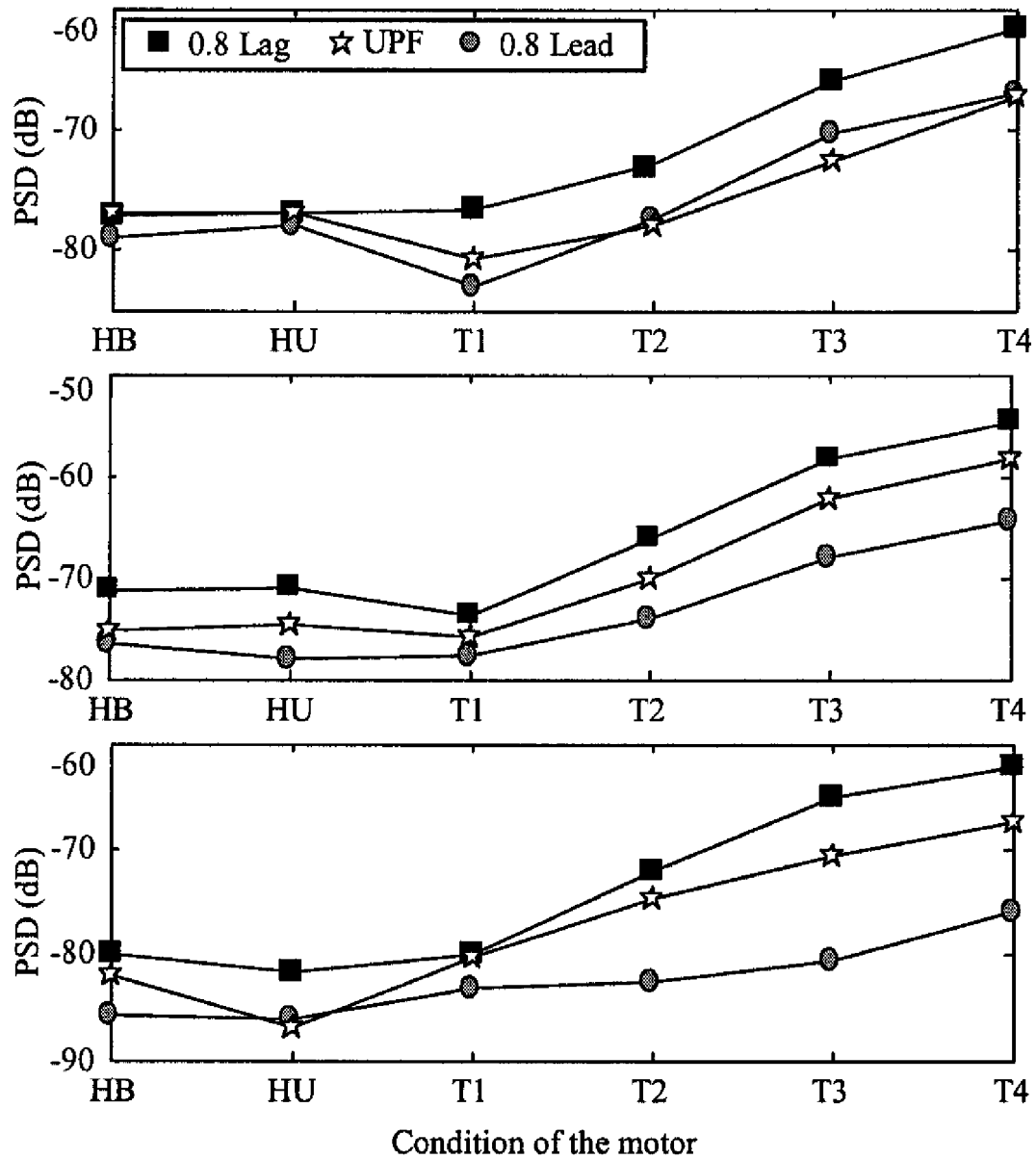
FIG. 11 contains plots of the 150 Hz component in the field current under no-load (top), half-load (middle) and full-load (bottom), 0.8 lagging pf condition (experimental).

The 150 Hz components in the excitation current showed the most prominent increase with the faults involving few turns. This was observed at all the three power factors under no-load, half-load and full-load conditions as shown in FIG. 11. The supply unbalance seemed to have minimal influence on this harmonic.

Figure 12:
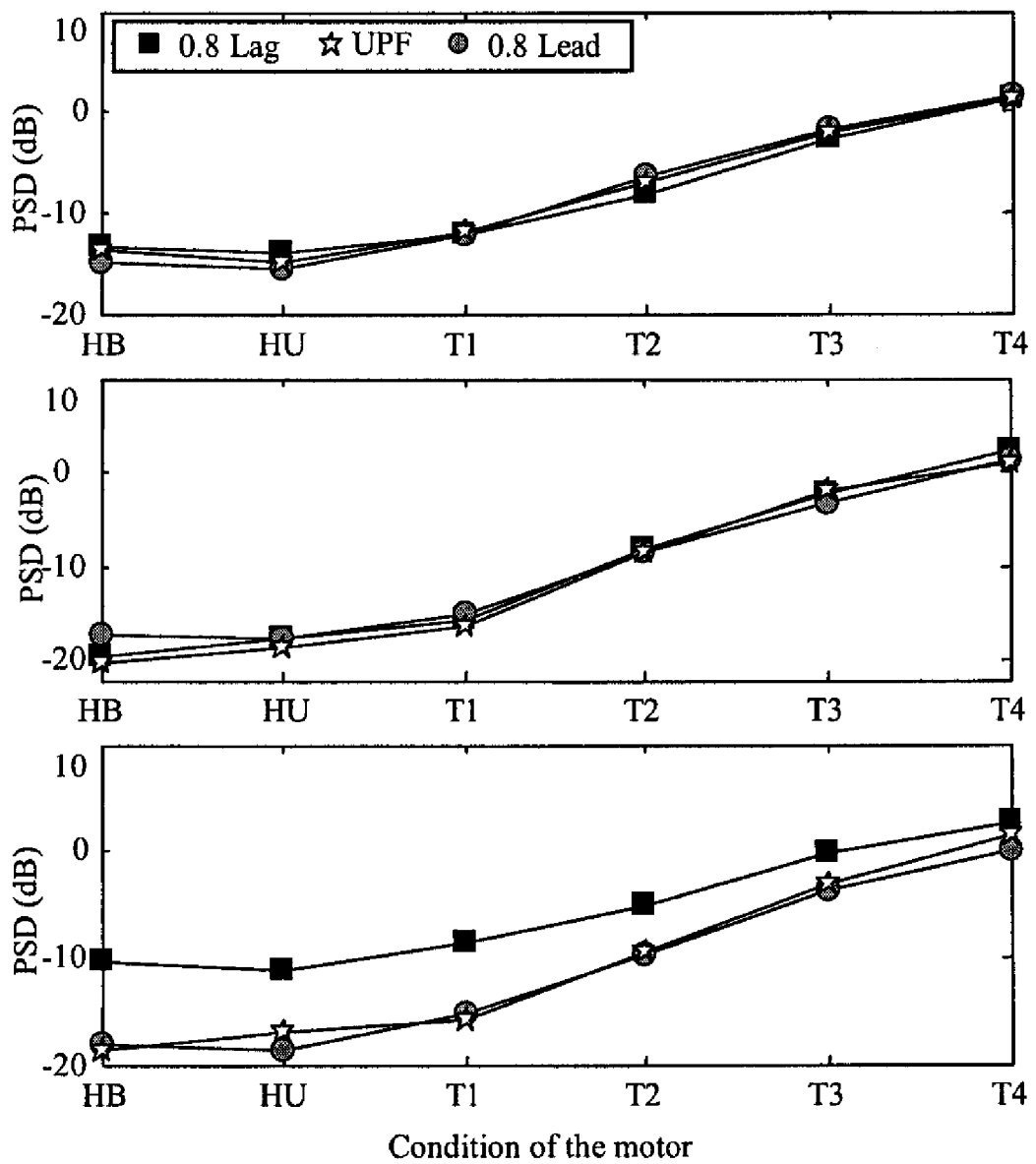
FIG. 12 contains plots of the 90 Hz component in the rotor search-coil under no-load (top), half-load (middle) and full-load (bottom), 0.8 lagging pf condition (experimental).

Further, the harmonic analysis of voltage induced in the rotor-mounted search-coil showed an even more encouraging increase of these frequency components with stator inter-turn fault. The rotor search-coil can accept a frequency of any pole-pair number independent of the asymmetry in the machine. The 90 Hz in the rotor search-coil voltage was found to be a very promising indicator of even one-turn faults at all operating conditions and was least affected by supply unbalance as shown in FIG. 12. The magnitudes of different harmonics have been normalized with respect to the DC and the 30 Hz components of the field current and the rotor search-coil voltage respectively.

In order to ensure dependability of these harmonics, five sets of data have been collected under all conditions of the motor: healthy motor with balanced supply (HB); healthy motor with unbalanced supply (HU); and with 1 to 4 turn shorts (T1 to T4). This was repeated under no-load, half-load and full-load conditions at three power factors (0.8 lag, 0.8 lead and unity power factor (UPF)). The 150 Hz components in the field current and the 90 Hz components in the rotor search-coil stood out prominently.

Figure 13:
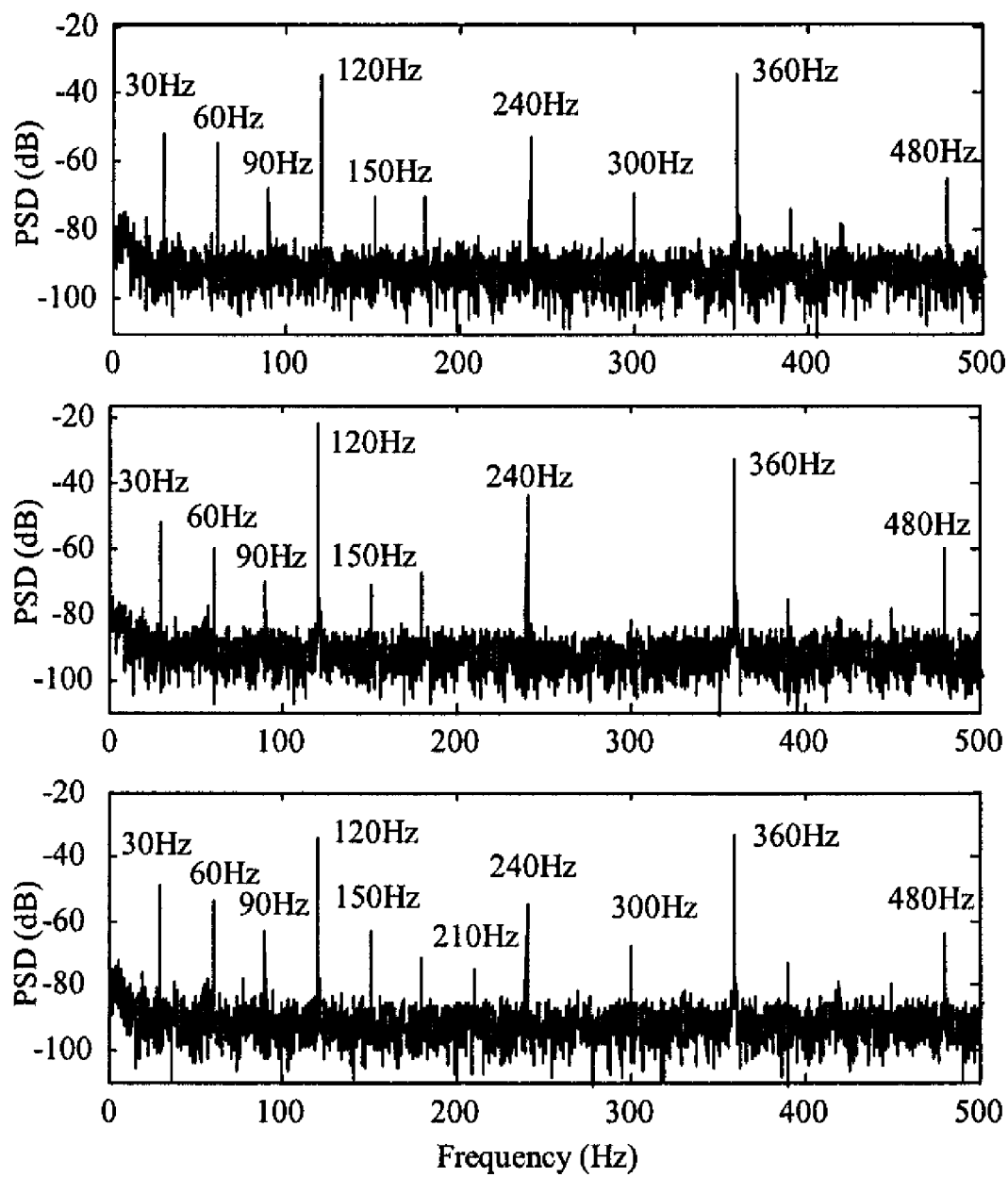
FIG. 13 contains plots of experimental PSD of field current under full-load, 0.8 lagging pf condition with balanced supply (top), with unbalanced supply (middle) and 4-turn fault (bottom) for a standard field winding.

One set of data was also collected for the motor with standard field winding at full load (0.8 lag). The corresponding plots under balanced supply, unbalanced supply and 4-turn fault are shown in FIG. 13. Once again the 90, 150 and 210 Hz components increased with fault and showed no increase under supply unbalance.

It was observed that the magnitudes of these harmonics seem to be dependent on the operating point of the machine. A probable reason may be explained by looking closely at Table I. For example, the 90 Hz component can be caused by both k=1 & 5. Similarly, the 150 Hz component can be caused by both k=3 & 7. Because of the variations in the load and power factor, the space distribution of these components may change resulting in variation of detection. Other factors such as, saturation, other time harmonics; eccentricity related low frequency components might also cause change in them. Tables similar to Table I can evaluate the influence of other time harmonics. The 120 and 180 Hz time harmonics (predominant ones in supply voltage, as seen in FIG. 6 (top)) can influence selection of a suitable field harmonic. A possible way to circumvent this problem is to have a look-up table describing the best harmonic to be selected in the field current or the rotor search coil voltage under a given operating condition.

On the basis of the foregoing, an equation was derived from Eq. (8) that can be used to predict the correct harmonic or harmonics to monitor in any synchronous machine.

$$f_d = \{(k/p) \pm 1\} f \quad (12)$$

Wherein $f_d$=possible frequencies of detection, k=is a positive integers, p=machine fundamental pole pair number (i.e., number of fundamental poles divided by 2), and f=line frequency.

The possible frequencies of detection in Hz are given by the line frequency in Hz multiplied by the set of all positive integers divided by the fundamental number of pole pairs with the integer one either added or subtracted to it.

The harmonics provided by the equation may be odd whole numbers, for example, but not limited to 3, 5, and 7, even whole numbers, for example, but not limited to 2, 4, 6, or fractional numbers, such as, but not limited to 1.5, 2.7, 4.4.

Analyzing the voltage induced in the rotor search-coil validated the diagnosis results. The 90 Hz component in the rotor search-coil appeared to be an indicator of even one-turn fault without any correction factor, in the test machine. The low values of standard deviations indicate less fluctuation of these harmonics at any given condition and hence imply more dependability. The scheme can be very easily implemented to ensure rapid tripping of the faulty machine inexpensively since only one signal has to be analyzed.

(iv) Instrumentation

Figure 14:
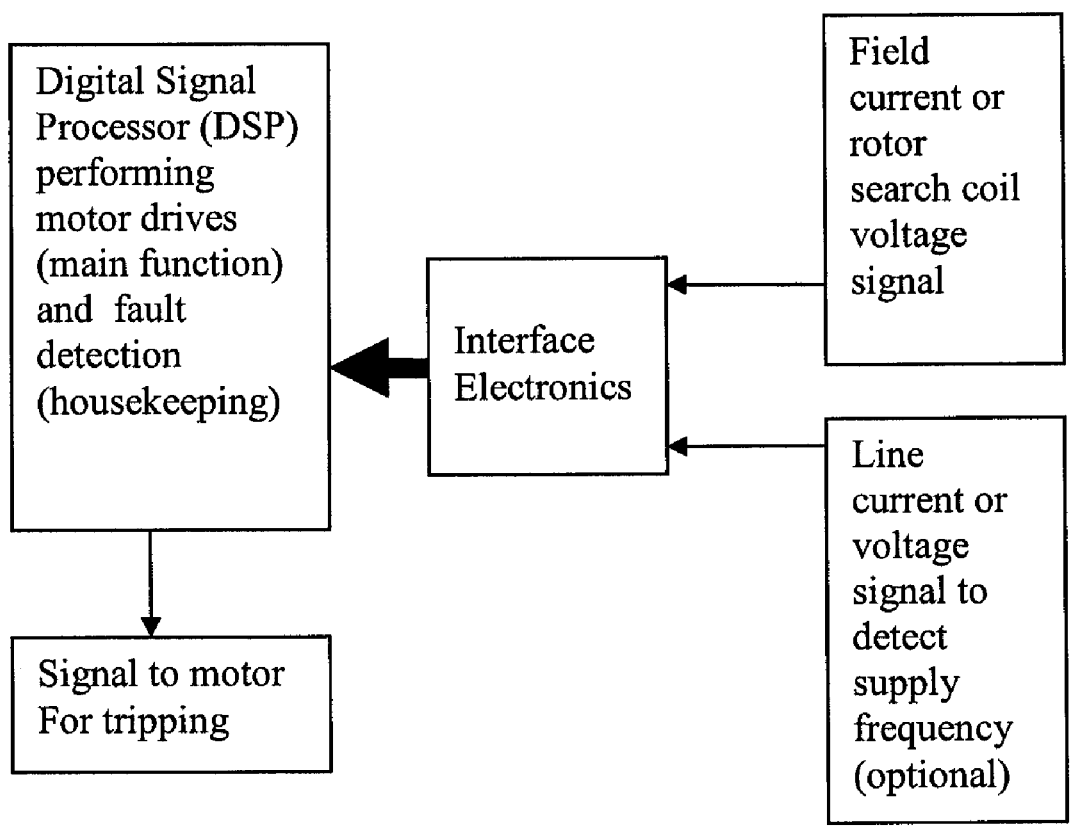
FIG. 14 is a block diagram of a representative system configured to detect inter-turn short circuit faults of synchronous machines.

The system to detect inter-turn short circuit fault of synchronous machine is shown in FIG. 14. The field current of the motor and the rotor search coil voltage were monitored to detect certain harmonics that are related to the supply frequency of the motor, as explained above. A tunable detector facilitates selecting and monitoring the appropriate harmonics. When the digital signal processor (DSP) or the microcontroller controlling the motor was also used to detect the fault as a housekeeping function, sensing the frequency information from the line current or voltage was not required. The tripping signal to the motor was used to open the circuit breaker. The time between sensing and generation of the tripping signal was within 2 seconds of detection, sufficient enough to stop fire hazards and explosions concomitant to stator inter-turn faults. The voltage measured by the rotor search coil provided much better sensitivity compared to the field current. Detection of even a 1 turn fault (out of 144 turns) was diagnosed with the rotor search coil.

The foregoing is an embodiment of the technology. As would be known to one skilled in the art, variations that do not alter the scope of the invention are contemplated. For example, look up tables can be generated for each condition of a machine that list the harmonics suitable for monitoring.

We claim:

1. A method of detecting stator inter-turn faults in a synchronous machine, the method comprising:
   (i) collecting at least one synchronous machine characteristic;
   (ii) predicting at least one harmonic frequency for monitoring the machine based on the at least one collected machine characteristic, wherein a ratio of the at least one harmonic frequency to a line frequency is substantially equal to k/p±1, wherein k is a positive integer and p is a number of fundamental pole pairs of the synchronous machine; and
   (iii) monitoring the at least one predicted harmonic frequency to determine a status of at least one stator.

2. The method of claim 1, further comprising detecting a stator inter-turn fault based on the monitoring of the at least one predicted harmonic frequency.

3. The method of claim 2, further comprising tripping the synchronous machine based on the detected fault.

4. The method of claim 1, wherein the at least one harmonic frequency is predicted based on a number of fundamental poles of the synchronous machine.

5. The method of claim 1, wherein the at least one harmonic frequency is an odd integer harmonic frequency or a fractional harmonic frequency.

6. The method of claim 1, wherein the predicted harmonic frequency is monitored based on a current.

7. The method of claim 1 wherein the predicted harmonic frequency is monitored based on a voltage.

8. The method of claim 7, wherein the monitoring is performed with a rotor search coil.

9. The method of claim 1, further comprising generating a tripping signal for the synchronous machine.

10. A system for detecting a stator inter-turn fault in a synchronous machine, the system comprising:
    a tunable detector configured to detect a monitor signal associated with at least a selected harmonic frequency associated with the synchronous machine, wherein a ratio of the at least one harmonic frequency to a line frequency is substantially equal to k/p±1, wherein k is a positive integer and p is a number of fundamental pole pairs of the synchronous machine; and
    a signal processor configured to provide a control signal for the synchronous machine based on the monitor signal.

11. The system of claim 10, further comprising a computer readable medium configured to store identifiers for a plurality of synchronous machine harmonic frequencies, wherein the detector is configured to receive the selected harmonic frequency based on the stored identifiers.

12. The system of claim 11, wherein the identifiers are stored in the computer readable medium in a look-up table.

13. The system of claim 10, wherein the signal processor is a digital signal processor.

14. The system of claim 10, wherein the signal processor is a computer.

15. The system of claim 10, wherein the tunable detector detects field current.

16. The system of claim 10, wherein the tunable detector detects a rotor search coil voltage.

17. A system for detecting a stator inter-turn fault in a synchronous machine, the system comprising:
    a signal processor configured to select at least one harmonic frequency associated with the synchronous machine, wherein a ratio of the least one selected harmonic frequency to a line frequency is substantially equal to equal to k/p±1, wherein k is a positive integer and p is a number of fundamental pole pairs of the synchronous machine;
    a rotor search coil;
    a tunable detector coupled to the rotor search coil and configured to provide a synchronous machine monitor signal to the signal processor, wherein the synchronous machine monitor signal is associated with the at least one selected harmonic frequency.

18. The system of claim 17, wherein the signal processor is a digital signal processor.

19. The system of claim 17, wherein the signal processor is a computer.

* * * * *